(12) United States Patent
Zhao (10) Patent No.: US 12,032,249 B2
(45) Date of Patent: Jul. 9, 2024

(54) ARRAY SUBSTRATE AND DISPLAY DEVICE

(71) Applicants: Beijing BOE Display Technology Co., Ltd., Beijing (CN); BOE TECHNOLOGY GROUP CO., LTD., Beijing (CN)

(72) Inventor: Chongyang Zhao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 505 days.

(21) Appl. No.: 17/418,364

(22) PCT Filed: Dec. 29, 2020

(86) PCT No.: PCT/CN2020/140831
§ 371 (c)(1),
(2) Date: Jun. 25, 2021

(87) PCT Pub. No.: WO2021/184906
PCT Pub. Date: Sep. 23, 2021

(65) Prior Publication Data
US 2022/0308383 A1 Sep. 29, 2022

(30) Foreign Application Priority Data
Mar. 18, 2020 (CN) .......................... 202010191556.9

(51) Int. Cl.
*G02F 1/1343* (2006.01)
*G02F 1/1362* (2006.01)
(Continued)

(52) U.S. Cl.
CPC .... *G02F 1/13439* (2013.01); *G02F 1/134345* (2021.01); *G02F 1/136286* (2013.01); *G02F 1/1368* (2013.01); *H01L 27/124* (2013.01)

(58) Field of Classification Search
CPC .......... G02F 1/13439; G02F 1/134345; G02F 1/136286; G02F 1/1368; G02F 1/136227;
(Continued)

(56) References Cited

U.S. PATENT DOCUMENTS

2015/0221773 A1 8/2015 Yokoi

FOREIGN PATENT DOCUMENTS

CN 101876769 A 11/2010
CN 101876769 B 11/2011
(Continued)

OTHER PUBLICATIONS

CN-107561800A (Year: 2018).*
(Continued)

*Primary Examiner* — Yara B Green
*Assistant Examiner* — Akhee Sarker-Nag
(74) *Attorney, Agent, or Firm* — Calfee, Halter & Griswold LLP (57) ABSTRACT

This disclosure relates to the displaying technical field, and provides an array substrate and a display device. The array substrate includes a base substrate, data lines and pixel electrodes. The data lines include adjacent first and second data lines. The pixel electrodes include at least one bridge pixel electrode, an orthographic projection of which on the base substrate is between orthographic projections of the first data line and the second data line on the base substrate. A first notch is provided on a side of the bridge pixel electrode close to the first data line, and a second notch is provided on a side of the bridge pixel electrode close to the second data line. The bridge pixel electrode of the array substrate has a similar lateral field capacitance to the data lines on both sides, thus reducing voltage crosstalk of the bridge pixel electrode and improving the display effect.

16 Claims, 5 Drawing Sheets

(51) Int. Cl.
*G02F 1/1368* (2006.01)
*H01L 27/12* (2006.01)

(58) Field of Classification Search
CPC ......... G02F 1/134363; G02F 1/134309; H01L 27/124
See application file for complete search history.

(56) References Cited

FOREIGN PATENT DOCUMENTS

| | | | |
|---|---|---|---|
| CN | 102468308 A | | 5/2012 |
| CN | 103091921 A | | 5/2013 |
| CN | 202939397 U | * | 5/2013 |
| CN | 202939397 U | | 5/2013 |
| CN | 10246830 B | | 12/2013 |
| CN | 102468308 B | | 12/2013 |
| CN | 107561800 A | * | 1/2018 |
| CN | 107561800 A | | 1/2018 |
| CN | 111176042 A | | 5/2020 |
| CN | 107561800 B | | 8/2020 |
| IN | 202888180 U | | 4/2013 |
| KR | 20060074325 A | | 7/2006 |
| WO | 2014038482 A1 | | 3/2014 |

OTHER PUBLICATIONS

International Search Report and Written Opinion from PCT/CN2020/140831 dated Apr. 6, 2021.
First Office Action from Chinese Application No. 202010191556.9 dated Feb. 3, 2021.
Notice of Allowance from Chinese Application No. 202010191556.9 dated Sep. 28, 2021.

* cited by examiner

ARRAY SUBSTRATE AND DISPLAY DEVICE

CROSS-REFERENCE TO RELATED APPLICATIONS

This application is the national stage entry of PCT/CN2020/140831, filed on Dec. 29, 2020, which is based on and claims priority to the Chinese patent application No. 202010191556.9, filed on Mar. 18, 2020 and tilted "ARRAY SUBSTRATE AND DISPLAY DEVICE", the entire contents of which constitute a part of this application and are incorporated herein by reference.

TECHNICAL FIELD

The present disclosure relates to the display technical field, in particular to an array substrate and a display device.

BACKGROUND

With continuous development of display technology, LCD display has already occupied a leading position in a display industry. A product with an ADS (Advanced Super Dimension Switch) structure has become a mainstream display mode because of having advantages such as wide viewing angle, fast response speed and high contrast. In the related art, it is required to provide a notch on a part of pixel electrodes in the display panel with the ADS structure; however, a display effect of a display panel can be affected by the notch.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

According to one aspect of the present disclosure, an array substrate is provided. The array substrate includes a base substrate, a plurality of data lines, and a plurality of pixel electrodes. The data lines include a first data line and a second data line adjacent to each other. The pixel electrodes include at least one bridge pixel electrode, in which an orthographic projection of the bridge pixel electrode on the base substrate is between an orthographic projection of the first data line and an orthographic projection of the second data line on the base substrate. A first notch is provided on a side of the bridge pixel electrode close to the first data line, and a second notch is provided on a side of the bridge pixel electrode close to the second data line.

In an exemplary embodiment of the present disclosure, the number of the bridge pixel electrodes is in plural, and the bridge pixel electrodes include a first bridge pixel electrode and a second bridge pixel electrode located in adjacent rows. The array substrate further includes a plurality of common sub-electrodes, a common connecting line and a connecting electrode. The common sub-electrodes and the pixel electrodes are arranged in one-to-one correspondence, and an orthogonal projection of one of the common sub-electrodes is at least partially overlapped with an orthogonal projection of a corresponding pixel electrode on the array substrate. The common connecting line is used for electrically connecting the common sub-electrodes in the same row. The connecting electrode includes a first connecting block and a second connecting block that are connected to each other. An orthographic projection of the first connecting block on the base substrate is within a range of an orthographic projection of the first notch of the first bridge pixel electrode on the base substrate, and an orthographic projection of the second connecting block on the base substrate is within a range of an orthographic projection of the first notch of the second bridge pixel electrode on the base substrate.

In an exemplary embodiment of the present disclosure, the first connecting block is electrically connected with the common sub-electrode corresponding to the first bridge pixel electrode through a via hole, the second connecting block is electrically connected with the common connecting line through a via hole, and the common connecting line is electrically connected with a common sub-electrode corresponding to the second bridge pixel electrode.

In an exemplary embodiment of the present disclosure, the first connecting block is electrically connected with the common sub-electrode corresponding to the first bridge pixel electrode through a via hole, and the second connecting block is electrically connected with the common sub-electrode corresponding to the second bridge pixel electrode through a via hole.

In an exemplary embodiment of the present disclosure, the array substrate further includes a data line extending along a second direction, and the common connecting line includes a lead portion and a bridging portion that are electrically connected. The lead portion extends along a first direction. An orthographic projection of the bridging portion on the base substrate is within a range of an orthographic projection of the first notch of the second bridge pixel electrode on the base substrate, a width of the bridging portion in the second direction is larger than a width of the lead portion in the second direction, and the second connecting block is electrically connected with the common connecting line through the bridging portion.

In an exemplary embodiment of the present disclosure, the array substrate further includes a gate line extending along a first direction, the first bridge pixel electrode and the second bridge pixel electrode are respectively located at both sides of the gate line, and the first notch of the first bridge pixel electrode and the first notch of the second bridge pixel electrode are arranged close to the gate line.

In an exemplary embodiment of the present disclosure, the first bridge pixel electrode and the second bridge pixel electrode are arranged in the same column. The array substrate further includes a gate line, an orthographic projection of the gate line on the base substrate is between orthographic projections of the common sub-electrodes in adjacent rows on the base substrate, and the gate line includes a wiring portion and a gate portion that are electrically connected. An orthographic projection of the gate portion on the base substrate is between orthographic projections of adjacent data lines on the base substrate, and a width of the gate portion is larger than a width of the wiring portion.

In an exemplary embodiment of the present disclosure, the array substrate further includes a thin film transistor, and the common connecting line and a gate layer of the thin film transistor are arranged in the same layer. The common sub-electrode is arranged on a side of the gate layer of the thin film transistor facing to the base substrate. The pixel electrode is arranged on a side of a source-drain layer of the thin film transistor facing away from the base substrate. The array substrate includes pixel electrodes for forming sub-pixel units in various colors, and the pixel electrodes corresponding to at least one color are the bridge pixel electrodes.

In an exemplary embodiment of the present disclosure, pixel electrodes in the same column form sub-pixel units in the same color, the pixel electrode corresponding to a first color is provided as a bridge pixel electrode, and the first common sub-electrode is provided corresponding to the bridge pixel electrode. First common sub-electrodes in the same row and adjacent columns are respectively connected with the common sub-electrodes in a superior row and the common sub-electrodes in an inferior row through the connecting electrodes.

According to one aspect of the present disclosure, a display device including the array substrate described above is provided.

Other features and advantages of the present disclosure will become apparent from the following detailed description, or in part, may be learned by practice of the present disclosure.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated in and constitute a part of this specification, illustrate embodiments consistent with the invention and, together with the description, serve to explain the principles of the invention. Apparently, the drawings in the following description are only some embodiments of the present disclosure and an ordinary skilled person in the art can also derive other drawings based on the drawings without doing any creative work.

DETAILED DESCRIPTION

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The features, structures or characteristics described herein may be combined in one or more embodiments in any suitable manner. In the following description, numerous specific details are provided to fully understand the embodiments of the present disclosure. However, those skilled in the art will recognize that the technical solutions of the present disclosure may be practiced without one or more of the specific details, or other components, steps and so on may be used. In other cases, the well-known technical solutions are not shown or described in detail to avoid obscuring various aspects of the present disclosure.

In addition, the drawings are merely schematic illustrations of the present disclosure and are not necessarily drawn to scale. The same reference numerals in the drawings refer to same or similar parts, and the repeated descriptions thereof will be omitted. Some of block diagrams shown in the drawings are functional entities, and do not necessarily correspond to physically or logically independent entities. These functional entities can be implemented in the form of software, in one or more hardware modules or integrated circuits, or in different networks and/or processor devices and/or microcontroller devices.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second", "third" and "fourth" are used herein only as markers, and they do not limit the number of objects modified after them.

Figure 1:
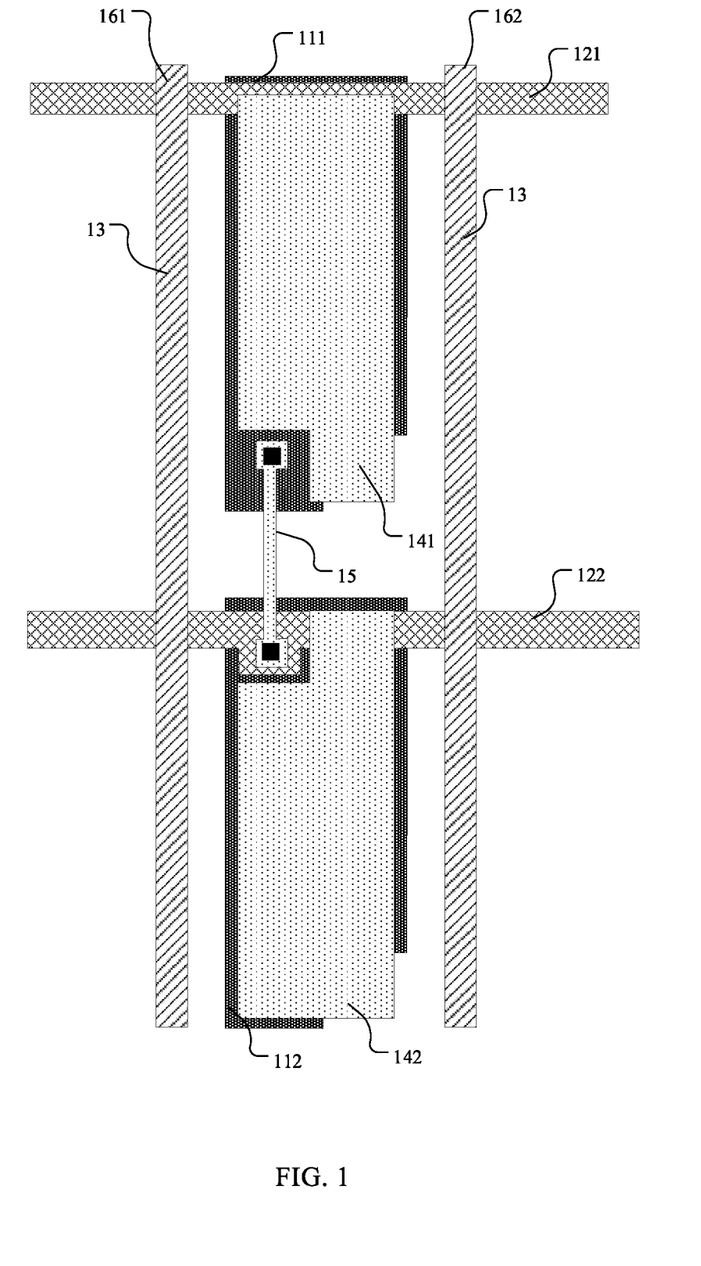
FIG. 1 is a schematic structural view of an array substrate in the related art.

FIG. 1 is a schematic structural view of an array substrate in the related art. The array substrate includes a plurality of pixel electrodes (such as 141 and 142 in FIG. 1) and common sub-electrodes (such as 111 and 112 in FIG. 1) distributed in an array, the pixel electrodes and the common sub-electrodes are oppositely arranged one by one, and an orthographic projection of the pixel electrode on the array substrate is at least partially overlapped with an orthographic projection of a corresponding common sub-electrode on the array substrate. The common sub-electrodes in the same row are electrically connected by a common connecting line, as shown in FIG. 1. All common sub-electrodes in the row of common sub-electrodes 111 are electrically connected by a common connecting line 121, and all common sub-electrodes in the row of common sub-electrodes 112 are electrically connected by a common connecting line 122. The common sub-electrodes 111 and 112 in adjacent rows are electrically connected through a connecting electrode 15. The connecting electrode 15 is located in the pixel electrode layer, and has one end electrically connected with the common sub-electrode 111 through a via hole and the other end electrically connected with the common connecting line 122 through a via hole, so as to connect the common sub-electrodes in the adjacent rows. As shown in FIG. 1, since it is required to provide the connecting electrode 15, corresponding notches are required to be provided at the lower left part of the pixel electrode 141 and the upper left part of the pixel electrode 142, so that the connecting electrode 15 may be electrically connected with the common sub-electrode through a via hole at the position of the notches. The pixel electrode with a notch may be called as a bridge pixel electrode. The bridge pixel electrode has a different lateral field capacitance from data lines 161 and 162 at the left and right sides thereof, as a result, problems such as voltage crosstalk (V-crosstalk) and horizontal stripes on the display screen can be caused when the voltage on the data lines changes.

Figure 2:
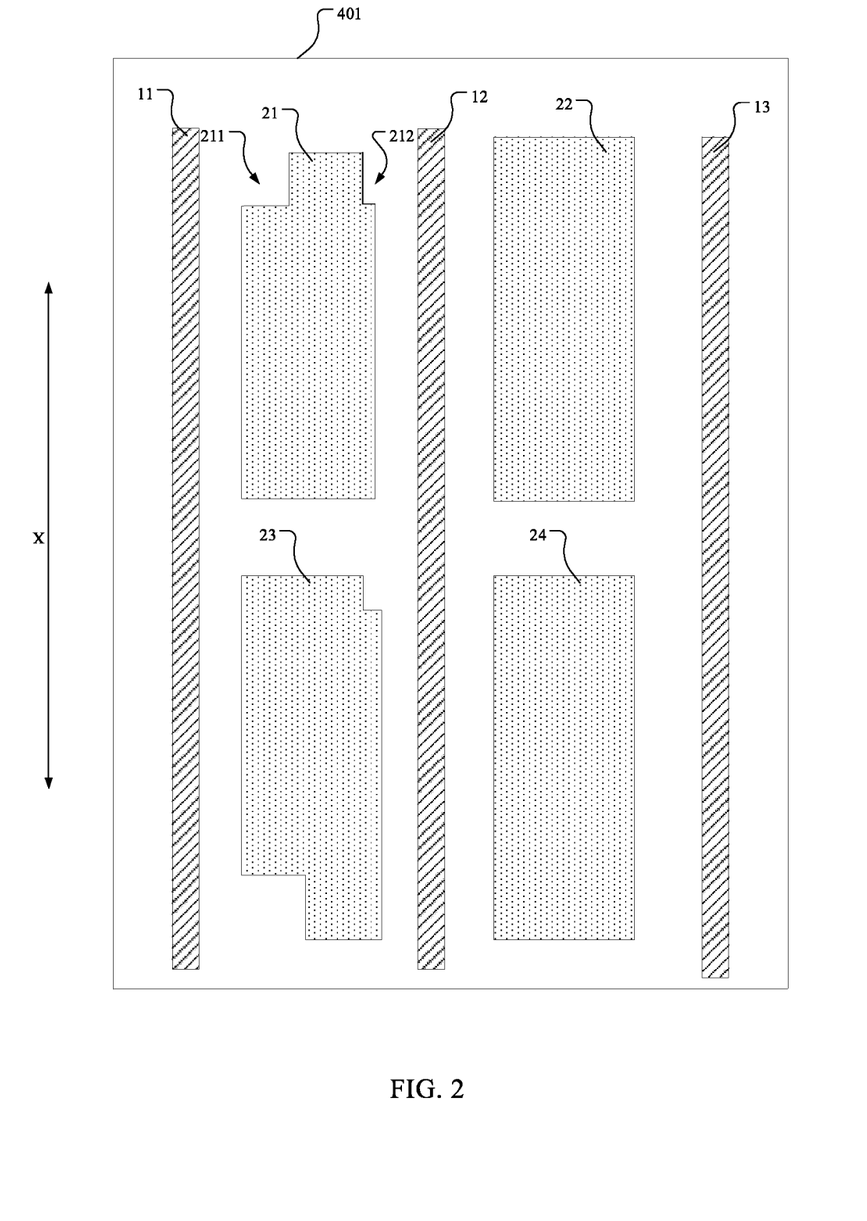
FIG. 2 is a structural schematic view of an exemplary embodiment of an array substrate of the present disclosure.

Based on this, this exemplary embodiment provides an array substrate, as shown in FIG. 2, which is a structural schematic view of the exemplary embodiment of the array substrate of the present disclosure. The array substrate includes a base substrate 401, a plurality of data lines 11, 12, 13, and a plurality of pixel electrodes 21, 22, 23, 24. The data lines extend along a second direction X and include a first data line 11 and a second data line 12 adjacent to each other. The pixel electrode include a bridge pixel electrode 21, and an orthographic projection of the bridge pixel electrode 21 on the base substrate 401 is between an orthographic projection of the first data line 11 and an orthographic projection of the second data line 12 on the base substrate. A first notch 211 is provided on a side of the bridge pixel electrode 21 close to the first data line 11, and a second notch 212 is provided on a side of the bridge pixel electrode 21 close to the second data line 12.

The array substrate is provided with notches on both sides of the bridge pixel electrode, wherein the first notch may be configured to arrange a connecting electrode, the first notch is arranged close to the first data line 11, and the second notch is arranged close to the second data line 12, so that the bridge pixel electrode has a similar later field capacitance to the data lines on both sides thereof, thereby reducing the problem of V-crosstalk of the bridge pixel electrode and improving the display effect.

An area of the first notch may be equal to or similar to an area of the second notch. The second notch may be arranged at any position of the bridge pixel electrode close to the second data line 12. As shown in FIG. 2, the second notch may be arranged at the upper right part of the bridge pixel electrode. It should be understood that the second notch may also be arranged at the lower right part of the bridge pixel electrode, or the like. The number of second notch may also be plural.

Figure 3:
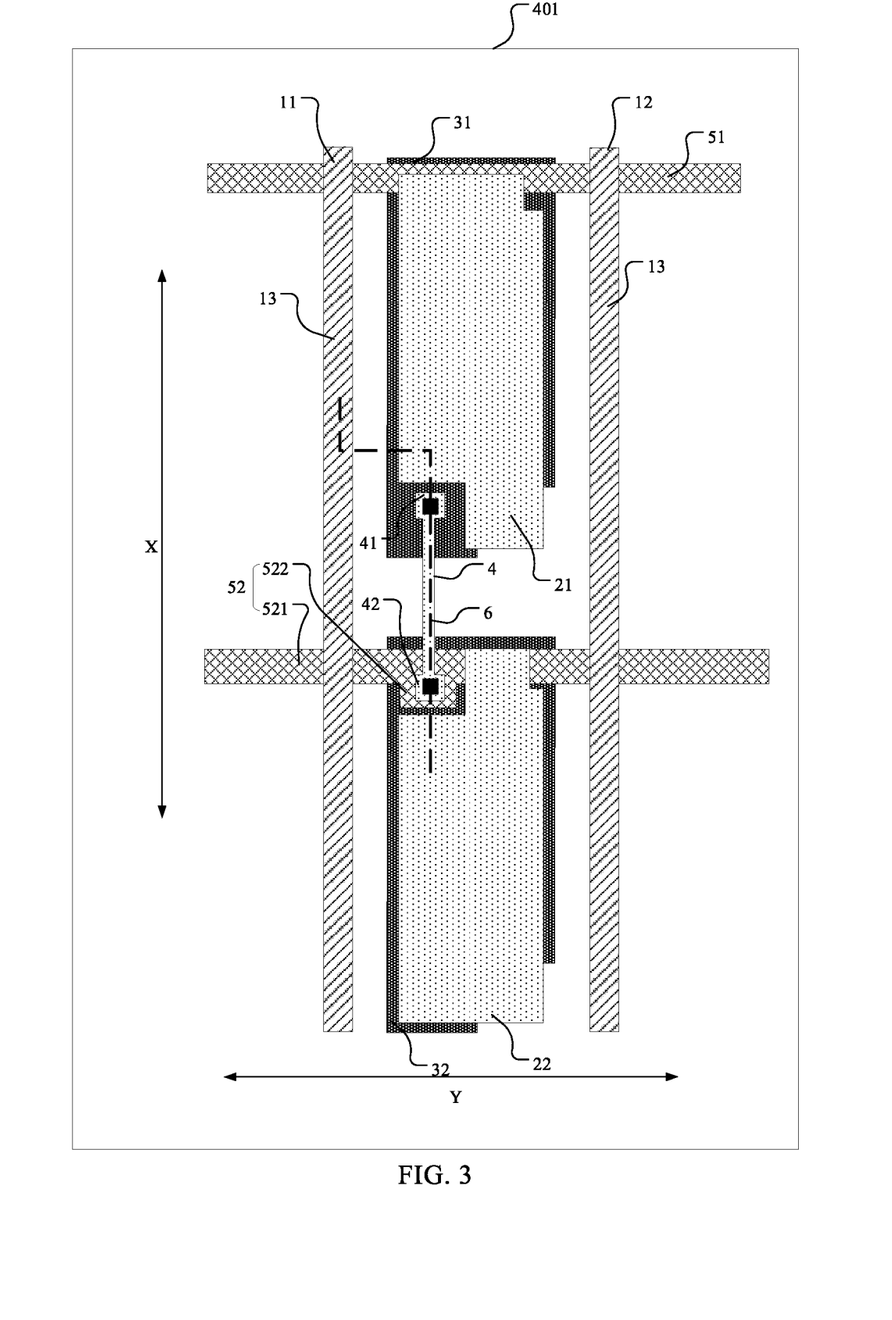
FIG. 3 is a structural schematic view of another exemplary embodiment of the array substrate of the present disclosure.

In this exemplary embodiment, as shown in FIG. 3, it is a structural schematic view of another exemplary embodiment of the array substrate of the present disclosure. The bridge pixel electrode may be provided in plural, and a plurality of the bridge pixel electrodes include a first bridge pixel electrode 21 and a second bridge pixel electrode 22 in adjacent rows. The array substrate may further include a plurality of common sub-electrodes (the common sub-electrodes 31 and 32 are exemplarily, as shown in FIG. 3) and a connecting electrode 4. The common sub-electrodes and the pixel electrodes are arranged in one-to-one correspondence, and an orthographic projection of the common sub-electrode on the base substrate is at least partially overlapped with an orthographic projection of the corresponding pixel electrode on the base substrate. For example, the common sub-electrode 31 is arranged corresponding to the first bridge pixel electrode 21, the common sub-electrode 32 is arranged corresponding to the second bridge pixel electrode 22, and the common sub-electrodes in the same row are electrically connected by the common connecting line. For example, all common sub-electrodes located in the row of the common sub-electrode 31 are electrically connected through the common connecting line 51, and all common sub-electrodes located in the row of the common sub-electrode 32 are electrically connected through the common connecting line 52. Exemplarily, the common connecting line may be directly formed on a side of the common sub-electrode facing away from the base substrate, and the common connecting line is directly connected with the common sub-electrode in a lapping joint manner, so that the common sub-electrodes located in the same row are electrically connected. Alternatively, in other embodiments, an insulating layer may be arranged between the common connecting line and the common sub-electrode, and the common connecting line and the common sub-electrode are electrically connected through a via hole penetrating through the insulating layer. The connecting electrode 4 includes a first connecting block 41 and a second connecting block 42 connected with each other, wherein an orthographic projection of the first connecting block 41 on the base substrate 401 is within a range of an orthographic projection of the first notch of the first bridge pixel electrode 21 on the base substrate, and an orthographic projection of the second connecting block 42 on the base substrate is within a range of an orthographic projection of the first notch of the second bridge pixel electrode 22 on the base substrate. The connecting electrode 4 and the pixel electrode may be in the same layer, that is, formed by the same patterning process, and made of the same material, but not necessarily on the same plane or at the same height. It should be understood that in other exemplary embodiments, the connecting electrode may also be located on other conductive layers.

Figure 4:
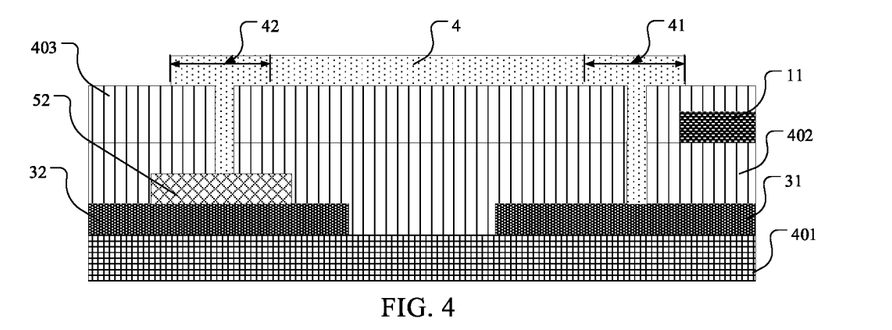
FIG. 4 is a sectional view shown by a dashed line 6 in FIG. 3.

In this exemplary embodiment, as shown in FIG. 3 and FIG. 4, FIG. 4 is a sectional view shown by the dashed line 6 in FIG. 3. The array substrate may include common sub-electrodes 31, 32, common connecting lines 51, 52, a data line 11, a first insulating layer 402, a second insulating layer 403 and a connecting electrode 4. The common sub-electrodes 31, 32 are arranged on a side of the base substrate 401. The common connecting lines 51, 52 are arranged on a side of the common sub-electrodes 31, 32 facing away from the base substrate 401. The first insulating layer 402 is located on a side of the common connecting lines 51, 52 facing away from the base substrate. The data line 11 is located on a side of the first insulating layer 402 facing away from the base substrate. The second insulating layer 403 is located on a side of the second insulating layer 403 facing away from the base substrate. And the connecting electrode 4 is located on a side of the second insulating layer 403 facing away from the base substrate. The array substrate may include a thin film transistor, and the common connecting lines 51, 52 and a gate electrode of the thin film transistor may be arranged on the same layer, that is, formed by one patterning process. The data line 11 and source and drain electrodes of the thin film transistor may be arranged on the same layer, that is, formed by one patterning process. The first connecting block 41 may be electrically connected with the common sub-electrode 31 corresponding to the first bridge pixel electrode 21 through a via hole, and the second connecting block 42 may be electrically connected with a common connecting line 52 through a via hole, in which the common connecting line 52 is electrically connected with the common sub-electrode 32 corresponding to the second bridge pixel electrode 42. The pixel electrode layer and the common electrode layer may be formed of an indium tin oxide, which has a certain transparency and thereby can improve a light emitting rate of the display panel. The gate layer may be formed of metal or alloy, for example, copper, aluminum, silver and other metals or alloys thereof. Since conductivity of metal is generally higher than that of indium tin oxide, the connection of the second connecting block 42 and the common sub-electrode 32 through the common connecting line 52 can reduce an electrical resistance between the second connecting block 42 and the common sub-electrode 32, thereby improving uniformity of the voltages on the respective common sub-electrodes.

In other exemplary embodiments, the first connecting block may also be electrically connected with the common sub-electrode corresponding to the first bridge pixel electrode through a via hole, and the second connecting block may also be directly electrically connected with the common sub-electrode corresponding to the second bridge pixel electrode through a via hole. These are within a protection scope of this disclosure.

In this exemplary embodiment, as shown in FIG. 3, the common connecting line 52 may include a lead portion 521 and a bridging portion 522 which are electrically connected. The lead portion 521 may extend along a first direction Y, an orthographic projection of the bridging portion 522 on the base substrate is within a range of the first notch of the second bridge pixel electrode 22. A width of the bridging portion 522 in the second direction X is larger than a width of the lead portion 521 in the second direction X, and the second connecting block 42 is electrically connected with the common connecting line 52 through the bridging portion 522. The lead portion 521 is configured to have a small width to reduce a parasitic capacitance between the lead portion 521 and the data line.

In this exemplary embodiment, as shown in FIG. 3, the first bridge pixel electrode 21 and the second bridge pixel electrode 22 may be located in the same column. Both the first notch of the first bridge pixel electrode 21 and the first notch of the second bridge pixel electrode 22 are arranged close to the gate line located therebetween. For example, as shown in FIG. 3, the first notch of the first bridge pixel electrode 21 is arranged at the lower left part of the first bridge pixel electrode 21, and the first notch of the second bridge pixel electrode 22 is arranged at the upper left part of the second bridge pixel electrode 22, and the connecting electrode may be electrically connected with the common sub-electrode through a via hole at the position of the notches. This arrangement can reduce an extension length of the connecting electrode, thus reducing the parasitic capacitance generated between the extension electrode and other structural layers. It should be understood that in other exemplary embodiments, the first bridge pixel electrode 21 and the second bridge pixel electrode 22 may be located in different columns. The first notch of the first bridge pixel electrode 21 and the first notch of the second bridge pixel electrode 22 may be arranged at other positions.

In this exemplary embodiment, the connecting electrode may electrically connect all the common sub-electrodes in a column direction only by electrically connecting part of the common sub-electrodes. Accordingly, only the part of pixel electrodes are required to be provided as the above-mentioned bridge pixel electrodes (i.e., the pixel electrodes with the notches), and the other pixel electrodes are normal pixel electrodes (i.e., the pixel electrodes without the notches). In this exemplary embodiment, the array substrate may include pixel electrodes corresponding to various colors, and the pixel electrodes in at least one color are the bridge pixel electrodes. Since the bridge pixel electrodes have different areas from the other normal pixel electrodes, the pixel electrodes of the sub-pixel units in the same color are provided as the bridge pixel electrodes, so that the pixel electrodes of the sub-pixel units in the same color have the same area, thus avoiding uneven light emission of the sub-pixel units in the same color.

Figure 5:
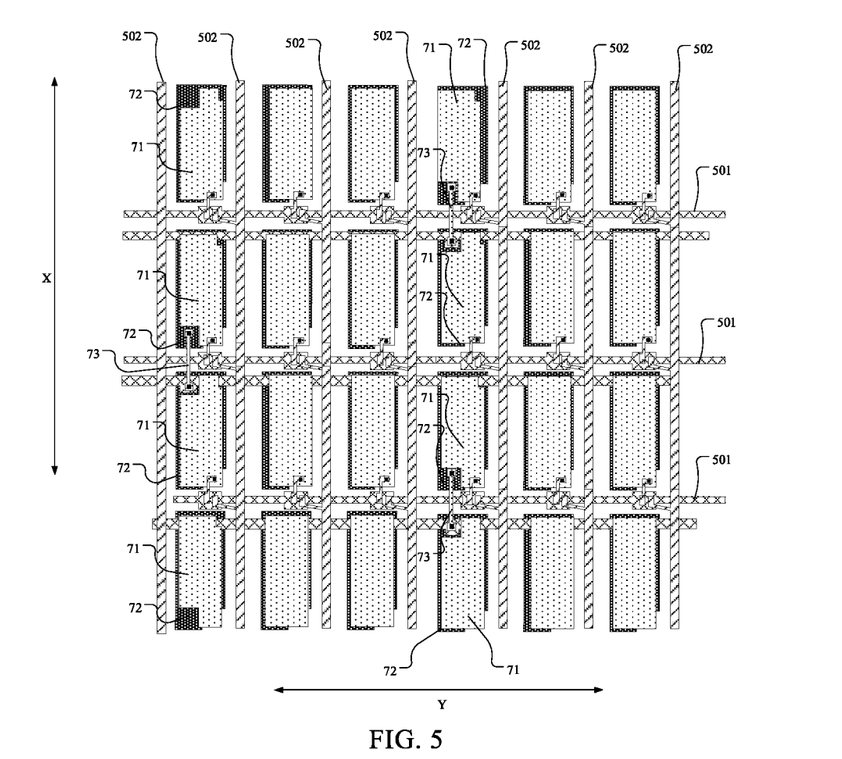
FIG. 5 is a structural schematic view of an exemplary embodiment of the array substrate of the present disclosure.

In this exemplary embodiment, as shown in FIG. 5, it is a structural schematic view of an exemplary embodiment of the array substrate of the present disclosure, in which 501 represents a gate line and 502 represents a data line, the gate line extends along the first direction Y and the data line extends along the second direction X. The array substrate may include sub-pixel units of three colors, in which the pixel electrodes in the $(n+1)^{th}$ column are located in the first color sub-pixel unit, the pixel electrodes in the $(n+2)^{th}$ column are located in the second color sub-pixel unit, and the pixel electrodes in the $(n+3)^{th}$ column are located in the third color sub-pixel unit. The pixel electrodes 71 corresponding to the first color are located in the $(n+1)^{th}$ column, and the pixel electrodes 71 are arranged corresponding to the common sub-electrodes 72. The pixel electrodes 71 are the bridge pixel electrodes. The common sub-electrodes 72 located in the same row and adjacent columns are respectively connected with the common sub-electrodes in a superior row and the common sub-electrodes in an inferior row through the connecting electrodes 73. As shown in FIG. 5, the common sub-electrode 72 in the third row and the first column is electrically connected with the common sub-electrode in the second row and the first column, and the common sub-electrode 72 in the third row and the fourth column is electrically connected with the common sub-electrode 72 in the fourth row and the fourth column. In this exemplary embodiment, the bridge pixel electrode may be located in the sub-pixel unit in the same color, thus avoiding uneven light emission of the sub-pixel units in the same color. In addition, it can be seen from FIG. 5 that the connecting electrodes are distributed at intervals along the first direction Y and the second direction X, in which the first direction Y may be a row direction, and the second direction X may be a column direction. In the row direction, the adjacent connecting electrodes are located in different columns, and in the column direction, the adjacent connecting electrodes are located in different rows. This arrangement can avoid the problem of uneven voltage on the common sub-electrodes caused due to that the charges on the common sub-electrodes extend along the same column direction.

Figure 6:
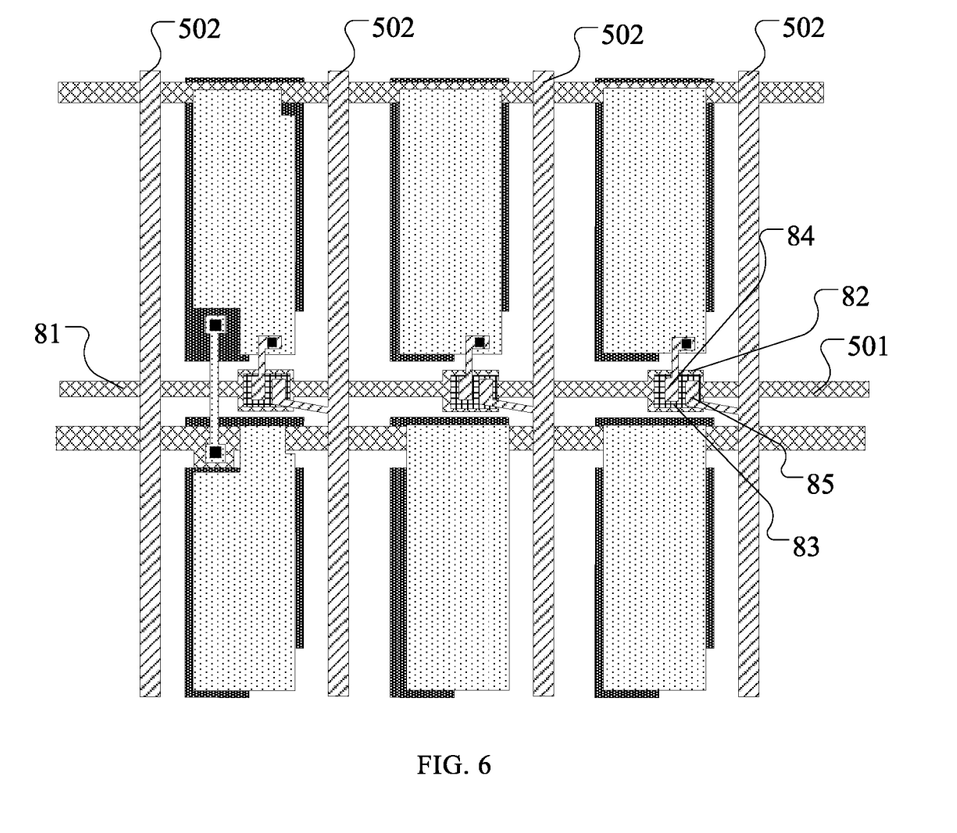
FIG. 6 is a partial enlarged view of FIG. 5.

In this exemplary embodiment, as shown in FIG. 5 and FIG. 6, FIG. 6 is a partial enlarged view of FIG. 5. The array substrate further includes a gate line 501, and an orthographic projection of the gate line on the base substrate is between orthogonal projections of the common sub-electrodes in adjacent rows on the base substrate. The gate line 501 includes a wiring portion 81 and a gate portion 82. An orthogonal projection of the gate portion 82 on the base substrate is between orthogonal projections of adjacent data lines 502 on the base substrate, and a width of the gate portion 82 in the extending direction of data lines is larger than a width of the wiring portion 81 in the extending direction of data lines. The gate portion 82 may form a gate electrode of a thin film transistor for controlling pixel switch. As shown in FIG. 6, the thin film transistor further includes an active layer 83, a first pole 85 and a second pole 84. The active layer 83 is located on a side of the gate portion 82 facing away from the base substrate, and an orthographic projection of the active layer 83 on the base substrate is on the orthographic projection of the gate portion 82 on the base substrate. The active layer 83 includes a channel region, a first source-drain contact portion and a second source-drain contact portion. The first pole 85 of the thin film transistor is connected to the data line 502, an orthographic projection of the first electrode 85 on the base substrate is at least partially overlapped with an orthographic projection of the first source-drain contact portion on the base substrate, and the first pole 85 is electrically connected with the first source-drain contact portion through a via hole. The second pole 84 of the thin film transistor is electrically connected with the pixel electrode, an orthographic projection of the second electrode 84 on the base substrate is at least partially overlapped with an orthographic projection of the second source-drain contact portion on the base substrate, and the second electrode 84 is electrically connected with the second source-drain contact portion through a via hole. The wiring portion 81 is configured to have a small width to reduce the parasitic capacitance between the wiring portion 81 and the data line 502.

The exemplary embodiment further provides a display panel including the array substrate described above. The display panel has the same technical characteristics and working principle as the array substrate described above, and will not be repeated herein.

This exemplary embodiment further provides a display device including the array substrate described above. The display device may be a mobile phone, a television, a tablet computer and other display devices.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

It will be understood that the present disclosure is not limited to the precise arrangements that have been described above and shown in the drawings, and may be modified and changed without departing from the scope thereof. The scope of the present disclosure is limited only by the appended claims.

What is claimed is:

1. An array substrate, comprising:
   a base substrate;
   a plurality of data lines comprising a first data line and a second data line adjacent to each other;
   a plurality of pixel electrodes comprising at least one bridge pixel electrode, wherein an orthographic projection of the bridge pixel electrode on the base substrate is between an orthographic projection of the first data line and an orthographic projection of the second data line on the base substrate;
   wherein a first notch is provided on a side of the bridge pixel electrode close to the first data line, and a second notch is provided on a side of the bridge pixel electrode close to the second data line;
   the number of the bridge pixel electrodes is in plural, and a plurality of the bridge pixel electrodes comprise a first bridge pixel electrode and a second bridge pixel electrode located in adjacent rows, and the array substrate further comprises:
   a plurality of common sub-electrodes, wherein the common sub-electrodes and the pixel electrodes are arranged in one-to-one correspondence, and an orthogonal projection of one of the common sub-electrodes is at least partially overlapped with an orthogonal projection of a corresponding pixel electrode on the array substrate;
   a common connecting line for electrically connecting the common sub-electrodes; and
   a connecting electrode comprising a first connecting block and a second connecting block connected to each other, wherein an orthographic projection of the first connecting block on the base substrate is within a range of an orthographic projection of the first notch of the first bridge pixel electrode on the base substrate, and an orthographic projection of the second connecting block on the base substrate is within a range of an orthographic projection of the first notch of the second bridge pixel electrode on the base substrate.

2. The array substrate according to claim 1, wherein the first connecting block is electrically connected with the common sub-electrode corresponding to the first bridge pixel electrode through a via hole, the second connecting block is electrically connected with the common connecting line through a via hole, and the common connecting line is electrically connected with the common sub-electrode corresponding to the second bridge pixel electrode.

3. The array substrate according to claim 2, wherein the array substrate further comprises a data line extending along a second direction, and the common connecting line comprises a lead portion and a bridging portion that are electrically connected, wherein
   the lead portion extends along a first direction that is different from the second direction;
   an orthographic projection of the bridging portion on the base substrate is located within a range of the orthographic projection of the first notch of the second bridge pixel electrode on the base substrate, a width of the bridging portion in the second direction is larger than a width of the lead portion in the second direction, and the second connecting block is electrically connected with the common connecting line through the bridging portion.

4. The array substrate according to claim 1, wherein the first connecting block is electrically connected with the common sub-electrode corresponding to the first bridge pixel electrode through a via hole, and the second connecting block is electrically connected with the common sub-electrode corresponding to the second bridge pixel electrode through a via hole.

5. The array substrate according to claim 1, wherein the array substrate further comprises a gate line extending along a first direction, the first bridge pixel electrode and the second bridge pixel electrode are respectively located at both sides of the gate line, and the first notch of the first bridge pixel electrode and the first notch of the second bridge pixel electrode are arranged close to the gate line.

6. The array substrate according to claim 1, wherein the first bridge pixel electrode and the second bridge pixel electrode are arranged in the same column;
   the array substrate further comprises a gate line extending along a first direction and a data line extending along a second direction, and the first direction is different from the second direction;
   an orthographic projection of the gate line on the base substrate is between orthographic projections of the common sub-electrodes in adjacent rows on the base substrate, and the gate line comprises a wiring portion and a gate portion that are electrically connected, wherein
   an orthographic projection of the gate portion on the base substrate is between orthographic projections of adjacent data lines on the base substrate, and a width of the gate portion in the second direction is larger than a width of the wiring portion in the second direction.

7. The array substrate according to claim 1, wherein the array substrate further comprises a thin film transistor, and the common connecting line and a gate electrode of the thin film transistor are arranged in the same layer;
   the common sub-electrode is arranged on a side of the gate electrode of the thin film transistor facing to the base substrate;
   the pixel electrode is arranged on a side of source and drain electrodes of the thin film transistor facing away from the base substrate;
   the array substrate comprises pixel electrodes for forming sub-pixel units in various colors, and the pixel electrodes corresponding to at least one color are the bridge pixel electrodes.

8. The array substrate according to claim 7, wherein the pixel electrodes in the same column form sub-pixel units in the same color, the pixel electrode corresponding to a first color is provided as a bridge pixel electrode, and the first common sub-electrode is provided corresponding to the bridge pixel electrode;

wherein the first common sub-electrodes in the same row and adjacent columns are respectively connected with common sub-electrodes in a superior row and the common sub-electrodes in an inferior row through the connecting electrodes.

9. A display device comprising an array substrate, wherein the array substrate comprises:
a base substrate;
a plurality of data lines comprising a first data line and a second data line adjacent to each other;
a plurality of pixel electrodes comprising at least one bridge pixel electrode, wherein an orthographic projection of the bridge pixel electrode on the base substrate is between an orthographic projection of the first data line and an orthographic projection of the second data line on the base substrate;
wherein a first notch is provided on a side of the bridge pixel electrode close to the first data line, and a second notch is provided on a side of the bridge pixel electrode close to the second data line;
the number of the bridge pixel electrodes is in plural, and a plurality of the bridge pixel electrodes comprise a first bridge pixel electrode and a second bridge pixel electrode located in adjacent rows, and the array substrate further comprises:
a plurality of common sub-electrodes, wherein the common sub-electrodes and the pixel electrodes are arranged in one-to-one correspondence, and an orthogonal projection of one of the common sub-electrodes is at least partially overlapped with an orthogonal projection of a corresponding pixel electrode on the array substrate;
a common connecting line for electrically connecting the common sub-electrodes; and
a connecting electrode comprising a first connecting block and a second connecting block connected to each other, wherein an orthographic projection of the first connecting block on the base substrate is within a range of an orthographic projection of the first notch of the first bridge pixel electrode on the base substrate, and an orthographic projection of the second connecting block on the base substrate is within a range of an orthographic projection of the first notch of the second bridge pixel electrode on the base substrate.

10. The display device according to claim 9, wherein the first connecting block is electrically connected with the common sub-electrode corresponding to the first bridge pixel electrode through a via hole, the second connecting block is electrically connected with the common connecting line through a via hole, and the common connecting line is electrically connected with the common sub-electrode corresponding to the second bridge pixel electrode.

11. The array substrate according to claim 10, wherein the array substrate further comprises a data line extending along a second direction, and the common connecting line comprises a lead portion and a bridging portion that are electrically connected, wherein the lead portion extends along a first direction that is different from the second direction;

an orthographic projection of the bridging portion on the base substrate is located within a range of the orthographic projection of the first notch of the second bridge pixel electrode on the base substrate, a width of the bridging portion in the second direction is larger than a width of the lead portion in the second direction, and the second connecting block is electrically connected with the common connecting line through the bridging portion.

12. The display device according to claim 9, wherein the first connecting block is electrically connected with the common sub-electrode corresponding to the first bridge pixel electrode through a via hole, and the second connecting block is electrically connected with the common sub-electrode corresponding to the second bridge pixel electrode through a via hole.

13. The array substrate according to claim 9, wherein the array substrate further comprises a gate line extending along a first direction, the first bridge pixel electrode and the second bridge pixel electrode are respectively located at both sides of the gate line, and the first notch of the first bridge pixel electrode and the first notch of the second bridge pixel electrode are arranged close to the gate line.

14. The array substrate according to claim 9, wherein the first bridge pixel electrode and the second bridge pixel electrode are arranged in the same column;
the array substrate further comprises a gate line extending along a first direction and a data line extending along a second direction, and the first direction being different from the second direction;
an orthographic projection of the gate line on the base substrate is between orthographic projections of the common sub-electrodes in adjacent rows on the base substrate, and the gate line comprises a wiring portion and a gate portion that are electrically connected, wherein an orthographic projection of the gate portion on the base substrate is between orthographic projections of adjacent data lines on the base substrate, and a width of the gate portion in the second direction is larger than a width of the wiring portion in the second direction.

15. The array substrate according to claim 9, wherein the array substrate further comprises a thin film transistor, and the common connecting line and a gate electrode of the thin film transistor are arranged in the same layer;
the common sub-electrode is arranged on a side of the gate electrode of the thin film transistor facing to the base substrate;
the pixel electrode is arranged on a side of source and drain electrodes of the thin film transistor facing away from the base substrate;
the array substrate comprises pixel electrodes for forming sub-pixel units in various colors, and the pixel electrodes corresponding to at least one color are the bridge pixel electrodes.

16. The array substrate according to claim 15, wherein the pixel electrodes in the same column form sub-pixel units in the same color, the pixel electrode corresponding to a first color is provided as a bridge pixel electrode, and the first common sub-electrode is provided corresponding to the bridge pixel electrode;
wherein the first common sub-electrodes in the same row and adjacent columns are respectively connected with common sub-electrodes in a superior row and the common sub-electrodes in an inferior row through the connecting electrodes.

* * * * *